United States Patent
Muralidhar et al.

(10) Patent No.: US 7,515,658 B2
(45) Date of Patent: Apr. 7, 2009

(54) METHOD TO ADAPTIVELY SCALE THE INPUT TO A CHANNEL DECODER

(75) Inventors: Karthik Muralidhar, Karnataka (IN); Christopher Anthony Aldridge, Singapore (SG); Ser Wah Oh, Johor (MY)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 903 days.

(21) Appl. No.: 10/879,491

(22) Filed: Jun. 29, 2004

(65) Prior Publication Data

US 2005/0286656 A1 Dec. 29, 2005

(51) Int. Cl.
- *H04L 27/06* (2006.01)
- *H04L 25/08* (2006.01)

(52) U.S. Cl. ........................................ 375/340; 375/346

(58) Field of Classification Search ................. 375/232, 375/242, 254, 262, 265, 340, 341, 346, 350; 714/794, 795

See application file for complete search history.

(56) References Cited

U.S. PATENT DOCUMENTS

| | | | |
|---|---|---|---|
| 7,231,577 B2* | 6/2007 | Richardson et al. | 714/758 |
| 2002/0025008 A1 | 2/2002 | Jurgensen et al. | |
| 2002/0067780 A1* | 6/2002 | Razzell | 375/341 |
| 2002/0126776 A1 | 9/2002 | Muck et al. | |
| 2003/0007577 A1* | 1/2003 | Shiu et al. | 375/341 |
| 2003/0138054 A1 | 7/2003 | Ha et al. | |

\* cited by examiner

*Primary Examiner*—Young T. Tse
(74) *Attorney, Agent, or Firm*—Lisa K. Jorgenson; William A. Munck

(57) ABSTRACT

The range R of effective bits (those containing information) within the N bit output(s) from an inner modem is determined and employed to select the M soft bits passed to a channel decoder, thereby avoiding underflow or overflow degrading the channel decoder performance. The average and standard deviation of 1P values for a base-two logarithm of the N bit output are used to determine the range R of effective bits, with the N bits shifted and clipped based on the computed value of R so that the M most significant bits from that range R are passed to the channel decoder.

18 Claims, 4 Drawing Sheets

METHOD TO ADAPTIVELY SCALE THE INPUT TO A CHANNEL DECODER

TECHNICAL FIELD OF THE INVENTION

The present invention is directed, in general, to processing inputs for channel decoders in wireless communication systems and, more specifically, to avoiding loss of performance during channel decoding in code division multiple access systems.

BACKGROUND OF THE INVENTION

First generation analog-based mobile tele-communication systems generally use a pair of dedicated radio channels with typically 30 kilo-Hertz (kHz) bandwidth to establish connection between the base station (BS) and mobile station (MS). Second generation, digital wireless telecommunication systems such as those conforming to the Global System for Mobile Communication (GSM) or Interim Standard 136 (IS-136), employ a time division multiple access (TDMA) approach in which each pair of dedicated radio channels convey a number of connections between the mobile station (s) and the base station, with each mobile station being allocated a timeslot on the channel. In those systems, the radio channel bandwidth is larger—for example, 200 kHz for GSM systems.

Code division multiple access (CDMA), used in Interim Standard 95 (IS-95) or Universal Mobile Tele-communication System (UMTS) Terrestrial Radio Access Frequency Division Duplex (UTRA FDD) mobile tele-communication systems, are spread spectrum systems employing a pair of radio channels with much larger bandwidth than either first or second generation systems—that is, 1.5 mega-Hertz (MHz) for IS-95 and 5.0 MHz for UTRA FDD. Each band conveys communications for multiple users, with each user assigned a pseudo-noise (PN) random sequence constructed from channelization and scrambling codes by which information is modulated as "symbols" onto the channel. A receiver having knowledge of the PN code for a particular user is able to distinguish that user from the others.

A typical wireless system includes a transmitter where information bits are encoded by a channel encoder and modulated by a modulator for transmission through a wireless communication channel having fading and additive white Gaussian noise (AWGN). A typical wireless receiver operating on wireless signals received from the channel includes an inner modem, such as a rake receiver in a UMTS Frequency Division Duplex (FDD) system, and a channel decoder to correct errors introduced by the channel. The receiver performance depends, to a large extent, on the performance of the channel decoder. A channel decoder working with a soft decision has approximately 3 decibels (dB) gain over a channel decoder working over hard decision input. However, that 3 dB gain can be lost without proper input of the received wireless signal to the channel decoder.

There is, therefore, a need in the art for a method of ensuring receiver performance in a wireless communication system.

SUMMARY OF THE INVENTION

To address the above-discussed deficiencies of the prior art, it is a primary object of the present invention to provide, for use in a wireless communication system, determination of a range R of effective bits (those containing information) within the N output bits from an inner modem for use in selecting the M soft bits to pass to a channel decoder, thereby avoiding underflow or overflow degrading the channel decoder performance. The average and standard deviation of 1P outputs are used to determine the range R of effective bits, with the N bits shifted and clipped based on the computed value of R so that the M most significant bits from that range R are passed to the channel decoder The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise,"as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 5D, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
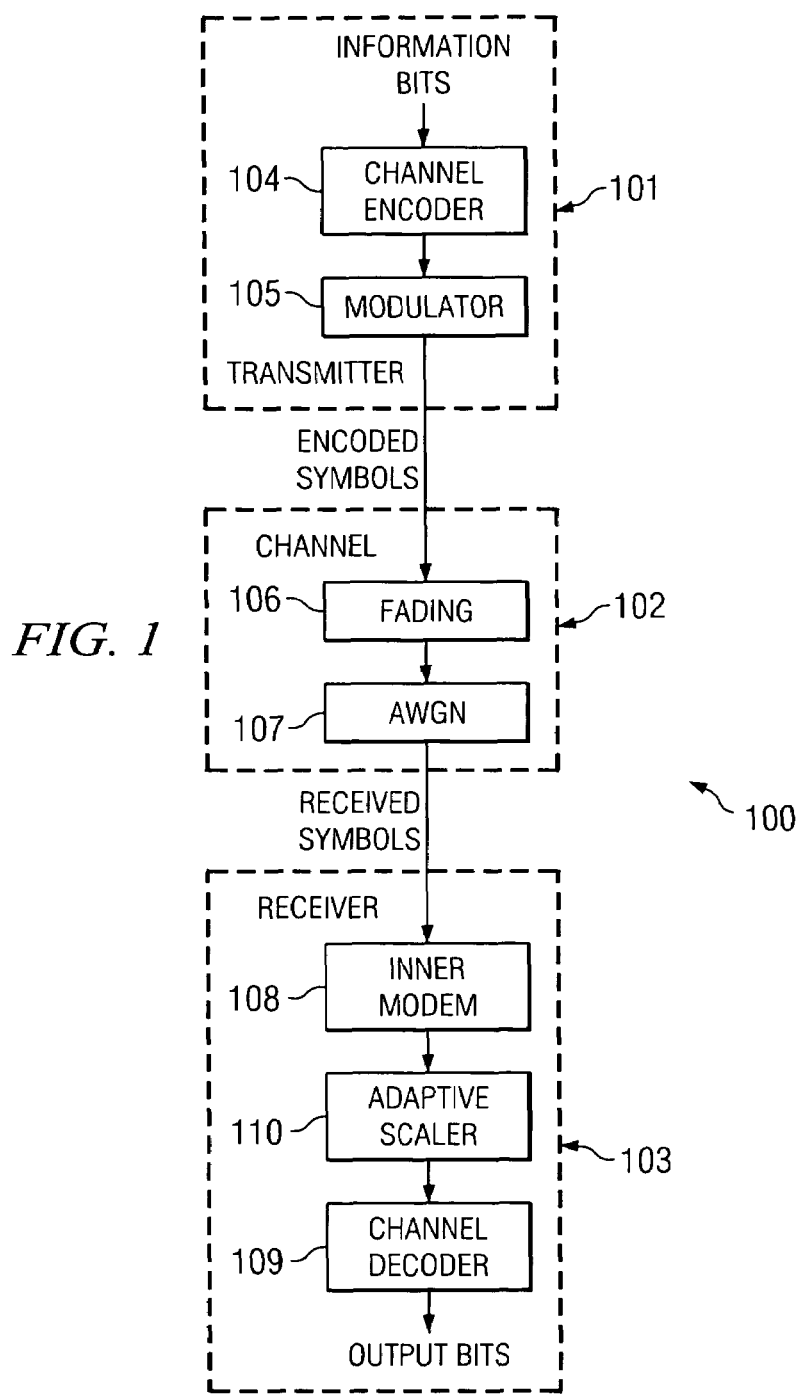
FIG. 1 is a high level diagram of a wireless communication system implementing adaptive scaling of the input to a channel decoder according to one embodiment of the present invention.

FIG. 1 is a high level diagram of a wireless communication system implementing adaptive scaling of the input to a channel decoder according to one embodiment of the present invention. Wireless communication system 100 includes a transmitter 101 transmitting symbols containing encoded information bits on a wireless communication channel 102 coupling transmitter 101 to a receiver 103.

Transmitter 101 receives information bits from an internal or external data processing circuit (not shown) at a channel encoder 104. The encoded information bits produced by channel encoder 104 are passed to a modulation unit 105, which generates symbols and transmits those symbols over wireless communication channel 102. Within wireless communication channel 102, the transmitted symbols are potentially subjected to at least fading and AWGN effects 106-107, such that the symbols received at receiver 103 may contain errors requiring correction. are potentially subjected to at least fading and AWGN effects 106-107, such that the symbols received at receiver 103 may contain errors requiring correction.

Within receiver 103, an inner modem 108 demodulates the received symbols for decoding by a channel decoder 109. The output bits produced by channel decoder 109 are passed to an internal or external data processing circuit (not shown). The present invention includes an adaptive scaler 110 within the receiver 103 between inner modem 108 and channel decoder 109, as described in further detail below.

Those skilled in the art will recognize that the complete structure and operation of a wireless communication system is not depicted and described herein. Instead, for simplicity and clarity, only so much of a wireless communication system as is unique to the present invention or necessary for an understanding of the present invention is shown and described.

In an exemplary embodiment, wireless communication system 101 is a UMTS FDD system. Such CDMA systems make use of the PN code that has a much higher bit rate than the symbol rate of the information bit sequence being encoded for transmission. That PN code bit rate (also referred to as "chip rate") is typically $2^l$ times higher than the symbol rate, where 1 is any positive non-zero integer (i.e., $2^{l=}2$, 4, 8, 16, 32, etc.). After modulation with the PN code, the information bit sequence is passed through a filter with a root-raised cosine frequency characteristic, with the resulting filtered signal presented to a radio frequency (RF) system for modulation onto an RF carrier.

The received signal is demodulated at the inner modem 108 by the conjugate PN sequence to produce bit output, typically using a rake finger with the output of many rake fingers combined by a rake combiner, with the rake fingers and rake combiner constituting a rake receiver normally used in UMTS FDD systems. The output from the rake receiver is passed on to the channel decoder 109, which may be a Viterbi/Turbo decoder.

The dynamic range of the output from inner modem 108 varies as a result of several factors: The inner modem 108 demodulates a particular physical channel, and the output is therefore dependent on the relationship of the physical channel power to the total received power. The dynamic range of the output from inner modem 108 is affected by the amount of amplification used by the receiver 103 based on Automatic Gain Control (AGC). In the case of UMTS FDD, the output from inner modem 108 is dependent on the number of fingers used to produce the output from the rake combiner, and the strengths of the multipath interferences associated with those fingers. Fading has a high impact on variation of the output from the inner modem 108, being the primary reason for rapid dynamic range fluctuations within short time intervals. Shadowing is a long term fading process where the signal varies due to topographical variation. Finally, power control has an impact on the received signal strength and the inner modem output.

As noted above, the transmitted symbols pass through channel 102, which introduce noise and distort the signal. At the transmitter side, the channel encoder 104 introduces additional information to the information bits being encoded and modulated and also randomizes the order of the information within the transmitted symbol stream. The additional information allows algorithms, such as the Viterbi algorithm, to recover the original bit sequence even though errors might exist within the received sequence. Randomization of the information protects against channel fading, which introduces burst errors into the received symbol stream. Channel decoders typically give optimal performance for eight bit input data as shown in TABLE I, which illustrates the number of soft bits for optimal performance for AWGN and fading channel effects, with increase in the bitwidth above eight bits not producing appreciable improvement in system performance.

TABLE I

|  | AWGN | Fading |
| --- | --- | --- |
| Viterbi decoder | 4 bits | 8 bits |
| Turbo decoder | 6 bits | 8 bits |

The output bitwidth of inner modem 108 is usually greater than eight bits, and thus should be scaled before being input to channel decoder 109. Since the output of inner modem 108 varies as described above, the output must be scaled such that the entire bitwidth of the channel decoder 109 (i.e., eight bits) is properly utilized. Too much scaling results in loss of performance due to underflow caused by loss of vital decoding information (since small values are truncated to zero), and failure to completely utilize decoder bitwidth. Too little scaling induces loss of performance due to saturation in the decoder, where all input values are clipped due to overflow. Accordingly, scaling of the input to the channel decoder 109 should be performed such that the decoder input utilizes the complete 8-bit bitwidth while avoiding underflow/overflow situations.

As described above, for optimal performance the output of inner modem 108 should be scaled to eight soft bits before being passed to the channel decoder 109. For instance, if sixteen bits are allocated for the output of the inner modem 108 and eight bits are allocated for the input of channel decoder 109, eight bits need to be appropriately selected by scaling the 16-bit inner modem output.

Figure 2A:
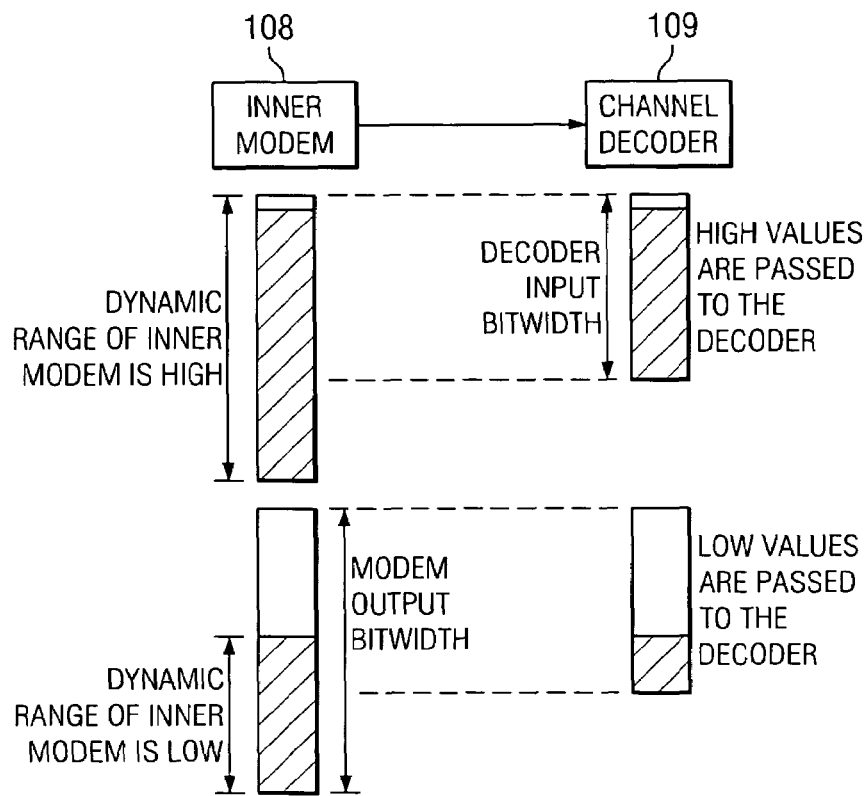
FIGS. 2A and 2B are comparative diagrams of, respectively, constant (or fixed) signal bit selection for scaling between the inner modem output and the channel decoder input and adaptive bit selection for scaling according to one embodiment of the present invention.
Figure 2B:
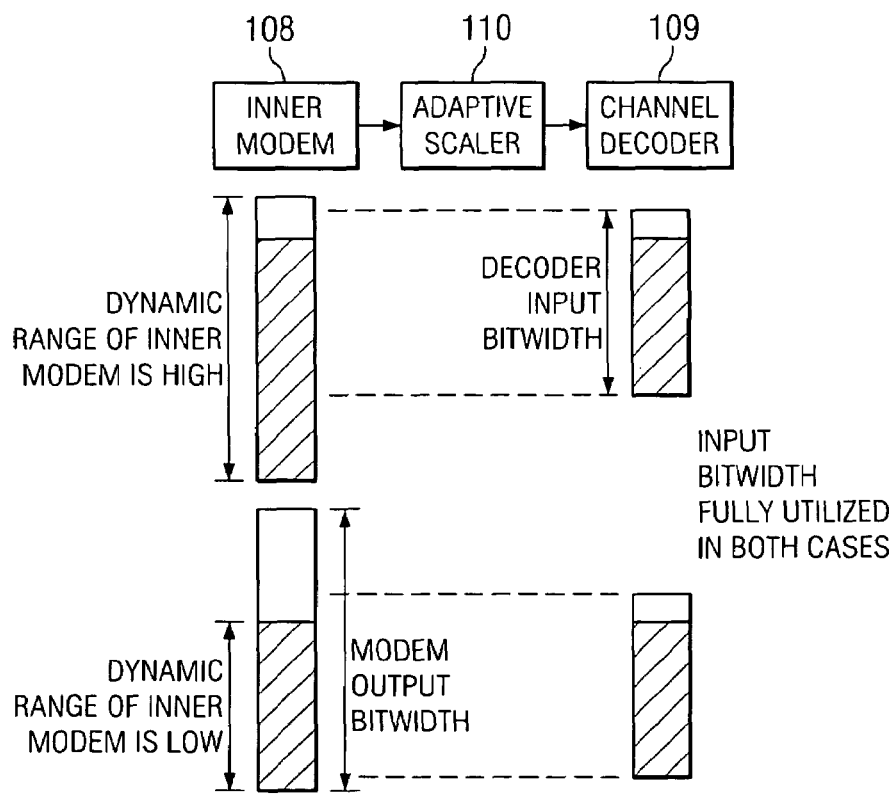

FIGS. 2A and 2B are comparative diagrams of, respectively, constant (or fixed) signal bit selection for scaling between the inner modem output and the channel decoder input and adaptive bit selection for scaling according to one embodiment of the present invention. Since the dynamic range of the output from the inner modem varies, constant bit selection for scaling as illustrated in FIG. 2A, in which the eight most significant bits (MSBs) of the output from inner modem 108 are selected as an example, will affect the decoder performance.

As shown in FIG. 2A, when the dynamic range of the inner modem output (represented by the cross-hatching) is 14-15 of the sixteen total bits, selecting the eight most significant bits will produce good performance since the input to channel decoder 109 properly utilizes the bitwidth provided. However, when the dynamic range of the inner modem output is only 9-10 bits (for instance), selecting the eight most significant bits would pass very low values to the channel decoder 109 and the bitwidth provided is not properly utilized. Those skilled in the art will recognize that any constant bit selection for scaling, regardless of which bits are selected, will result in poor performance at some point within the dynamic range of the inner modem.

FIG. 2B illustrates adaptive bit selection from the output from inner modem 108 for use by the input of channel decoder 109, in which the set of bits selected for scaling match the instantaneous dynamic range of the inner modem output. The adaptive bit selection for scaling ensures that decoder bitwidth is properly utilized even when the modem output varies, providing optimal decoder performance under varying modem output conditions.

Figure 3:
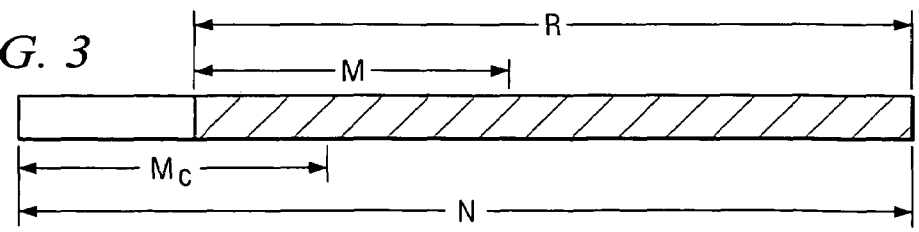
FIG. 3 diagramatically illustrates adaptive scaling of inner modem output for input to a channel decoder according to one embodiment of the present invention.

FIG. 3 diagramatically illustrates adaptive scaling of inner modem output for input to a channel decoder according to one embodiment of the present invention. The inner modem 108 has N dedicated output bits, while the channel decoder 109 has M dedicated input bits and R is the number of effective bits—that is, the number of bits that contain information— within the output from the inner modem 108. With constant scaling, choosing the M most significant bits $M_c$ results in underflow and small values are passed to the decoder. The input to the inner modem 108 is the sum of all users' data and many physical channels, while the output of inner modem 108 is only one physical channel for a particular user. Consequently the power of the output is much less than the total power of the input, and although N bits are allocated for the inner modem output, choosing the most significant M bits as the input to the channel decoder 109 results in performance loss as described above.

As illustrated in FIG. 3, depending on the power of the channel being decoded and other factors described above, the useful information at the output from inner modem 108 is limited to a range of R bits. Adaptive scaler 110 measures tracks the variation of the inner modem output range R and passes the appropriate M bits (i.e., the M most significant bit from the set of R bits) to the channel decoder 109, resulting in minimal loss of data.

Figure 4:
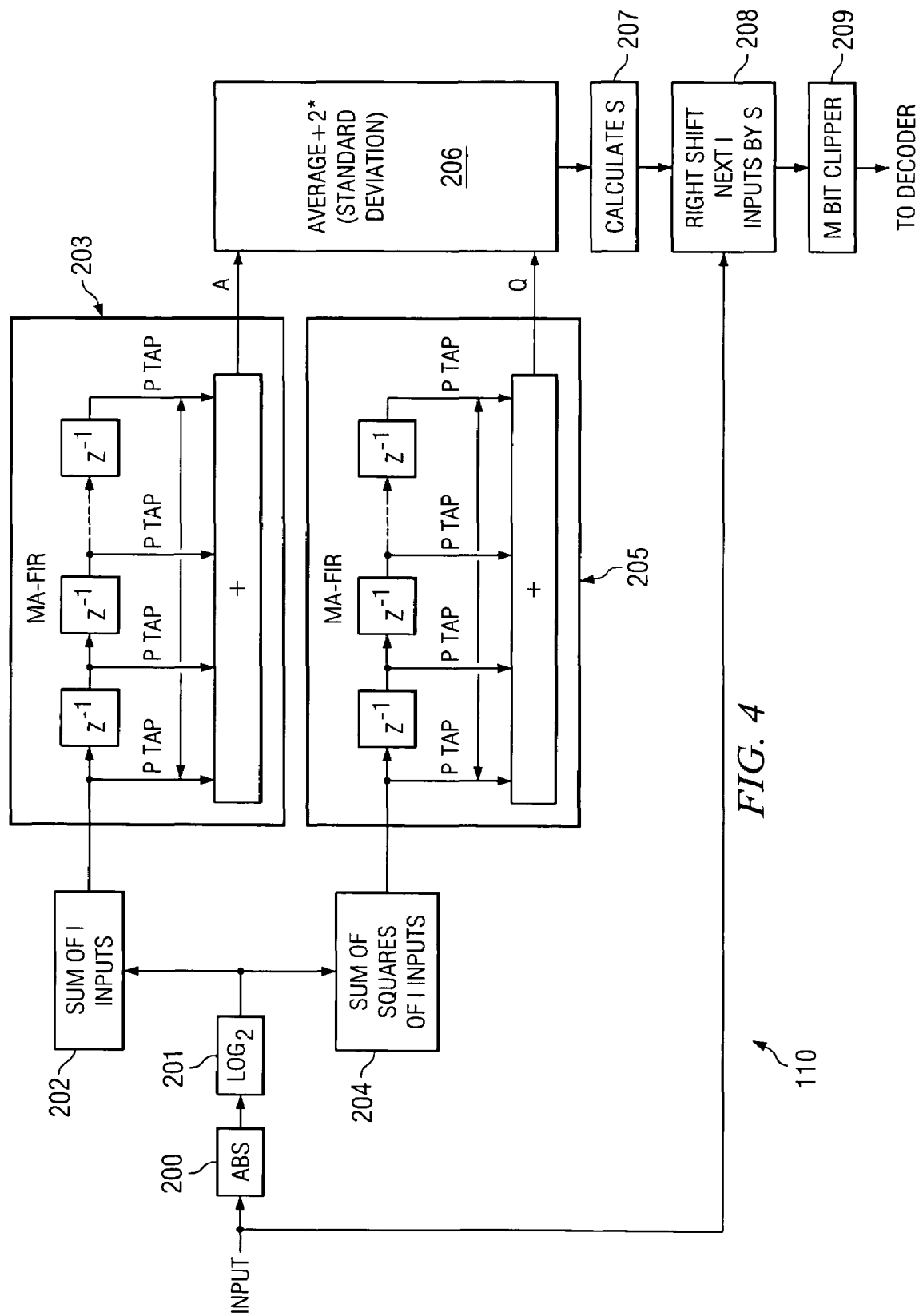
FIG. 4 is a block diagram for an adaptive scaler in accordance with one embodiment of the present invention.

FIG. 4 is a block diagram for an adaptive scaler in accordance with one embodiment of the present invention. Adaptive scaler 110 dynamically detects the range R of the input data and scales the input data accordingly. The input to the adaptive scaler 110 is the N bit output of inner modem 108, and adaptive scaler 110 generates M soft bits to the channel decoder 109.

Adaptive scaler 110 includes an input for receiving the N bit output of inner modem 108 at an absolute value computation unit 200. A $\log_2$ operation is performed by unit 201 on the absolute value of the input as part of identifying the effective bits R to be used as the input to the channel decoder 109, where the range R is dependent on the strength of the particular signal being demodulated by the inner modem 108 and changes with time. The $\log_2$ operation drastically reduces computational complexity.

Adaptive scaler 110 estimates the variation in effective bits R by calculating the average and standard deviation of the $\log_2$ values from unit 201, which may then be used to scale the input to the channel decoder 109 to the M required soft bits. After taking the absolute value and performing the $\log_2$ operation, the outputs from unit 201 are arranged into blocks of 1 values, from which the sum of these values is calculated by summing unit 202. The moving-average finite impulse response (MA-FIR) filter 203 calculates the sum of P outputs from unit 202, which is equivalent to the sum of the previous 1P values at the outputs of the unit 201. The sum of the squares of 1 values for the output of unit 201 is calculated by summing unit 204. The MA-FIR filter 205 calculates the sum of P outputs from unit 204, which is equivalent to the sum of squares of the previous 1P values for the output of unit 201. Each filter 203 and 205 has P taps updated once every 1 inputs to calculate the sum or sum of the squares, respectively, of the outputs from unit 201.

The output A of filter 203 is employed by computation unit 206 to calculate the average μ of P1 outputs from unit 201 (where typically P=32 and 1=4) from:

$$\mu = \frac{A}{Pl},$$

and the output Q of the second filter 205 is employed by computation unit 206 to calculate the standard deviation σ of P1 outputs from unit 201 from:

$$\sigma = \sqrt{\frac{Q}{Pl} - \mu^2}.$$

The number of bit shifts S—that is, the amount of scaling to be applied to the output of the inner modem 108—is calculated by unit 207 once every 1 inputs as follows:

$R=(\mu=2\sigma)$;

if$R-M<0$, then $S=0$;

else $S=R-M$, where the constant k=2 is employed for the exemplary embodiment.

Based on the above algorithm if R≦M, no scaling is performed on the output of the inner modem 108 before that output is passed to the channel decoder 109. Otherwise, the output of the inner modem 108 is right-shifted by S bits in unit 208, and the result is finally clipped to M bits by unit 209 before being passed to channel decoder 109. Clipping unit 209 saturates big values if the values are greater than M bits and ensures that the output is limited to M bits. FIGS. 5A through 5D depict comparative simulation plots for constant scaling versus adaptive scaling according to one embodiment of the present invention. One thousand blocks of CDMA Data Control Channel (DCCH) and Data Transport Channel (DTCH) traffic were processed with, respectively, Viterbi and turbo decoding, base station output power gain of zero dB, and N=16 and M=8. The transmission modeled employed is case 1 from UE Radio Transmission and Reception (FDD). 3GPP TS25.101 v.4.0.0.2. The inner modem input included 10 bits: seven bits to quantize the fractional portion, two bits for the integer, and one bit for the sign.

Figure 5A:
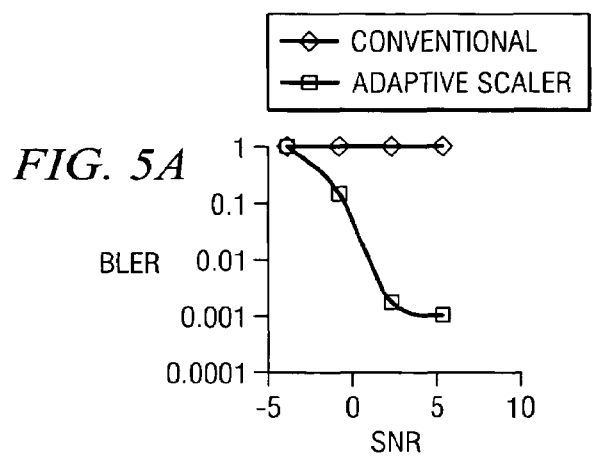
FIGS. 5A through 5D depict comparative simulation plots for constant scaling versus adaptive scaling according to one embodiment of the present invention.
Figure 5B:
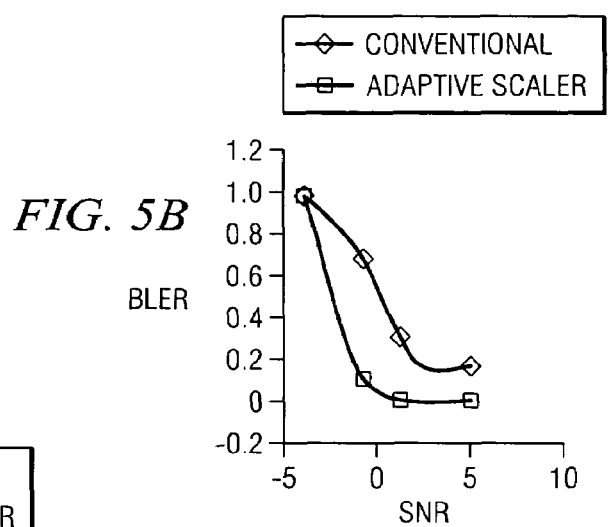
Figure 5C:
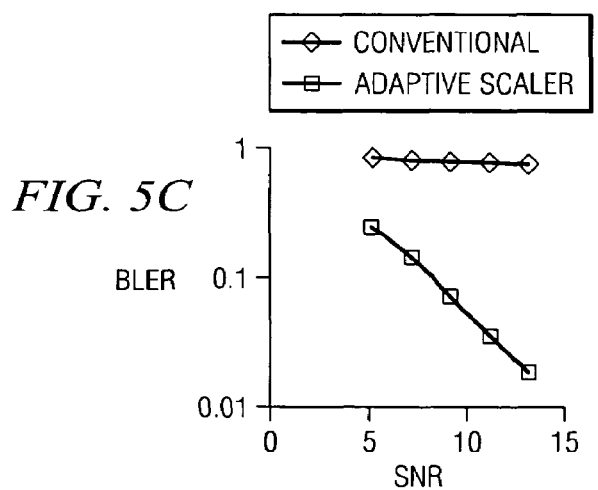
Figure 5D:
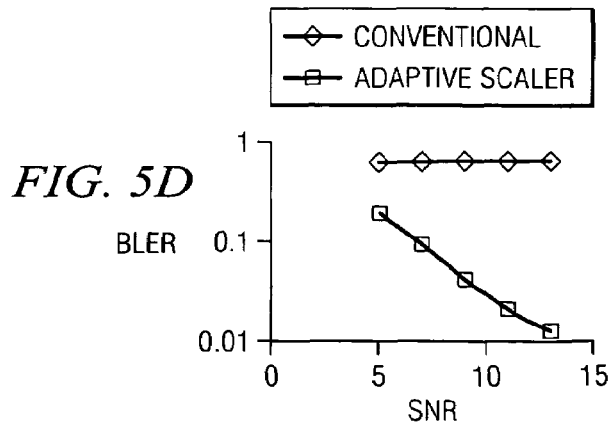

In the simulation plots of FIGS. 5A to 5D, adaptive scaling was compared with the performance of constant scaling in which the M most significant bits of the N bit inner modem output is used as the input to the channel decoder. FIGS. 5A and 5B depict the block error rate (BLER) versus signal-to-noise ratio (SNR) for adaptive and conventional (constant) scaling under AWGN channel conditions for DTCH and DCCH, respectively. Significant gain is achieved by using adaptive scaling, especially if the inner modem output is low. FIGS. 5C and 5D depict BLER versus SNR for adaptive and conventional scaling under fading conditions in which the velocity of the mobile is 240 kilometers/hour (Km/h), with the fading taps normalized to unity, for DTCH and DCCH, respectively. As shown, conventional scaling yields poor results attributable to very low values being passed to the channel decoder, which may be improved using adaptive scaling.

The present invention utilizes adaptive scaling to scale the inner modem output in CDMA systems to pass M soft bits as input to the channel decoder without significant loss of performance despite variation in inner modem output range. Data bits in a digital communication system are encoded using channel coding (e.g., convolutional or turbo) at the transmission side and decoded using channel decoding (e.g., Viterbi or turbo) at the receiving side. The inputs to the channel decoder are soft bits, so performance decreases if the data is not scaled before being passed to the channel decoder.

Since Viterbi and turbo decoders give optimal performance with a 4-8 bit soft decision, the input to the channel decoder should be adaptively matched to 4-8 bits to avoid loss of performance. Adaptive scaling provides such matching. The present invention may be used between the output of an inner modem (e.g., Rake fingers) and the input to a channel decoder (Viterbi or turbo) in a CDMA-based system such as FDD mode Wideband CDMA (WCDMA).

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. An adaptive scaler comprising:
   one or more N bit inputs;
   one or more computation units determining a range R of the N bit inputs containing information; and
   one or more M bit outputs, the M bit outputs including a predetermined number of most significant bits from the range R of the N bit inputs containing information,
   wherein the one or more computation units calculate an average and a standard deviation of values for at least some of the N bit inputs in determining the range R of the N bit inputs containing information,
   wherein M, N and R are positive integers.

2. The adaptive scaler according to claim 1, wherein the one or more computation units calculate a bit shift for the N bit inputs from the average and the standard deviation.

3. The adaptive scaler according to claim 2, further comprising:
   a shifting unit shifting the N bit inputs by the bit shift to produce a shifted bit sequence; and
   a clipping unit receiving the shifted bit sequence and outputting the M bit outputs.

4. The adaptive scaler according to claim 3, wherein the shifting unit shifts the N bit inputs by zero when the bit shift is negative.

5. The adaptive scaler according to claim 1, wherein the one or more computation units comprise:
   a first unit for computing an absolute value of the N bit inputs;
   a second unit computing a base-two logarithm of the absolute value of the N bit inputs;
   first and second filters filtering signals derived from the base-two logarithm of the absolute value of the N bit inputs; and
   a third unit computing the average and the standard deviation of the N bit inputs based on the filtered signals produced by the first and second filters.

6. The adaptive scaler according to claim 1, wherein the adaptive scaler at least partially compensates for dynamic range variation in the N bit inputs.

7. A wireless communication device including the adaptive scaler according to claim 1, the wireless communication device comprising:
   an inner modem producing the N bit inputs received by the adaptive scaler; and
   a channel decoder operating on the M bit outputs by the adaptive scaler.

8. A wireless communication system including the wireless communication device according to claim 7, the wireless communication system comprising:
   an other wireless communication device transmitting wireless signals for reception by the wireless communication device; and
   a wireless communication channel carrying the wireless signals between the wireless communication device and the other wireless communication device.

9. An adaptive scaling method comprising:
   receiving one or more N bit inputs;
   determining a range R of the N bit inputs containing information using one or more computation units;
   transmitting one or more M bit outputs, the M bit outputs including a predetermined number of most significant bits from the range R of the N bit inputs containing information; and
   calculating an average and a standard deviation of outputs of a base-two logarithmic unit in determining the range R of the N bit inputs containing information,
   wherein M, N and R are positive integers.

10. The method according to claim 9, further comprising:
    calculating a bit shift for the N bit inputs from the average and the standard deviation.

11. The method according to claim 10, further comprising:
    shifting the N bit inputs by the bit shift to produce a shifted bit sequence; and
    outputting the M bit outputs based on the shifted bit sequence.

12. The method according to claim 11, further comprising:
    shifting the N bit inputs by zero when the bit shift is negative.

13. The method according to claim 9, further comprising:
    computing an absolute value of the N bit inputs;
    computing a base-two logarithm of the absolute value of the N bit inputs;
    filtering signals derived from the base-two logarithm of the absolute value of the N bit inputs; and
    computing a value based on the average and the standard deviation of the filtered signals.

14. The method according to claim 9, further comprising:
at least partially compensating for dynamic range variation in the N bit inputs.

15. An adaptive scaling system comprising:
an inner modem demodulating received wireless signals;
a channel decoder decoding symbols represented by the received wireless signals; and
an adaptive scaler scaling N bits demodulated by the inner modem, wherein the scaling is performed by
  computing an average and a standard deviation for 1 values for a base-two logarithm of an absolute value of the N bits,
  shifting the N bits on the inner modem output by an amount computed based on the average and the standard deviation,
  selecting a predetermined number M of most significant bits from the shifted N bits, and
  passing the selected M bits to the channel decoder,
wherein I, M and R are positive integers.

16. The adaptive scaling system according to claim 15, wherein the adaptive scaler computes the average by
  computing the absolute value of the N bits,
  computing the base-two logarithm of the absolute value of the N bits,
  summing the 1 values for the base-two logarithm of the absolute value of the N bits,
  generating a moving average, finite impulse response filter response to the sum of the 1 values, and
  computing the average from the filter response.

17. The adaptive scaling system according to claim 16, wherein the adaptive scaler computes the standard deviation by
  computing the absolute value of the N bits,
  computing the base-two logarithm of the absolute value of the N bits,
  summing squares of the 1 values of the base-two logarithm,
  generating a moving average, finite impulse response filter response to the sum of squares of the 1 values for the base-two logarithm, and
  computing the standard deviation from the average and the filter response.

18. The adaptive scaling system according to claim 15, wherein the N bits are not shifted if the amount computed based on the average and the standard deviation is negative.

* * * * *